United States Patent
Peng et al.

(10) Patent No.: US 8,152,372 B1
(45) Date of Patent: Apr. 10, 2012

(54) METHODS FOR MONITORING CHIP TEMPERATURE DURING TEST

(75) Inventors: Hsui-Peng Peng, San Jose, CA (US); Jae-Hong Lee, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 648 days.

(21) Appl. No.: 12/121,581

(22) Filed: May 15, 2008

Related U.S. Application Data

(60) Provisional application No. 61/045,806, filed on Apr. 17, 2008.

(51) Int. Cl.
*G01K 7/00* (2006.01)
*G01K 3/00* (2006.01)

(52) U.S. Cl. ........ 374/178; 374/170; 374/137; 327/512; 327/513

(58) Field of Classification Search .......... 374/178, 374/137
See application file for complete search history.

(56) References Cited

U.S. PATENT DOCUMENTS

| | | | | |
|---|---|---|---|---|
| 6,696,491 | B2* | 2/2004 | Meakin et al. | 514/552 |
| 6,984,064 | B1* | 1/2006 | Touzelbaev | 374/43 |
| 7,198,403 | B2* | 4/2007 | Proll et al. | 374/178 |
| 7,412,346 | B2* | 8/2008 | Bashir et al. | 702/130 |

* cited by examiner

*Primary Examiner* — Lisa Caputo
*Assistant Examiner* — Mirellys Jagan

(57) ABSTRACT

Described herein are methods and apparatuses for testing an integrated circuit chip including a thermal diode. According to various embodiments, a method for testing an integrated circuit chip including a thermal diode may comprise performing a test operation on the integrated circuit chip, and during the test operation, detecting a signal representative of a temperature sensed by a thermal diode embedded in the integrated circuit chip. Other embodiments may be described and claimed.

6 Claims, 4 Drawing Sheets

300

METHODS FOR MONITORING CHIP TEMPERATURE DURING TEST

CROSS REFERENCE TO RELATED APPLICATIONS

The present application claims priority to U.S. Patent Application No. 61/045,806, filed Apr. 17, 2008, entitled "METHODS FOR MONITORING CHIP TEMPERATURE DURING TEST," the entire specifications of which are hereby incorporated by reference in their entirety for all purposes, except for those sections, if any, that are inconsistent with this specification.

TECHNICAL FIELD

Embodiments of the present invention relate generally to the field of integrated circuits, and more particularly, to electrical testing of integrated circuits.

BACKGROUND

In the current state of integrated circuit technology, an integrated circuit chip will often be tested for defects to ensure the quality and reliability of the chip or chips similar thereto. As part of such testing, the chips, also referred to as "devices under test" (DUT), may be subject to various test patterns and the DUT's response to the test patterns may determine whether the DUT passes or fails the testing.

As part of some testing protocols, the DUT is subject to electrical testing while exposed to various predetermined temperatures to simulate conditions the DUT may later experience in the field. Thermal control equipment may be used for subjecting the DUT to the predetermined temperature(s) and possibly for controlling the temperature of the DUT during the testing protocol. In general, however, the DUT's immediate thermal response to any one or more of various testing protocols is not monitored.

With respect to monitoring the temperature of a chip in the field, the chip may include a thermal diode, which may provide a temperature reading. The temperature reading may be used for ensuring the chip operates in a desired temperature range because it is generally known that a chip's temperature may fluctuate depending on processing load, chip defects, system anomalies, etc. Such temperature readings may be used for thermally controlling the chip by, for example, the use of fans or other cooling operations, or by managing the power usage of the chip.

The thermal diode, however, is not used for thermal monitoring of a DUT during testing. Even though the temperature of the DUT may be controlled during test or during field use, thermal monitoring during test may also be desired for further ensuring the quality and reliability of chips.

SUMMARY OF THE INVENTION

In view of the challenges in the state of the art, embodiments of the present invention are directed to methods and apparatuses for testing an integrated circuit chip including a thermal diode. According to various embodiments, a method for testing an integrated circuit chip including a thermal diode may comprise performing a test operation on the integrated circuit chip, and during the test operation, detecting a signal representative of a temperature sensed by a thermal diode embedded in the integrated circuit chip. A test operation may comprise one or more test patterns or suites comprising one or more electrical stimuli.

According to various embodiments, a method for testing the integrated circuit chip may comprise determining whether the detected temperature conforms, at least in part, to a predetermined temperature limit. In some of the embodiments, if the temperature is determined to conform to the predetermined temperature limit, another test operation may be performed on the integrated circuit chip, if necessary.

In some embodiments, a thermal profile for the integrated circuit chip may be generated. In various embodiments, generating a thermal profile for the integrated circuit chip may be based at least in part on a plurality of detected temperatures. According to various embodiments, the generated thermal profile may be used for determining the temperature limits associated with the test operations.

A testing apparatus is also described, suitable to solve the problems upon which at least one embodiment of the invention is based, with a mass storage device and at least one processor coupled to the mass storage device. In various embodiments, the mass storage device may have stored therein a plurality of programming instructions designed to facilitate performing a first test operation on an integrated circuit chip, and during the first test operation, detecting a signal representative of a first temperature sensed by a thermal diode embedded in the integrated circuit chip. The at least one processor may be configured to execute the programming instructions.

An article of manufacture adapted to enable a testing apparatus for performing one or more methods as described herein is also described. According to some embodiments, the article of manufacture may comprise a storage medium, and a plurality of programming instructions stored in the storage medium. The programming instructions may be adapted to program a testing apparatus to enable the apparatus to perform a first test operation on an integrated circuit chip, and during the first test operation, detect a signal representative of a first temperature sensed by a thermal diode embedded in the integrated circuit chip.

Other features that are considered as characteristic for various embodiments of the present invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Figure 1:
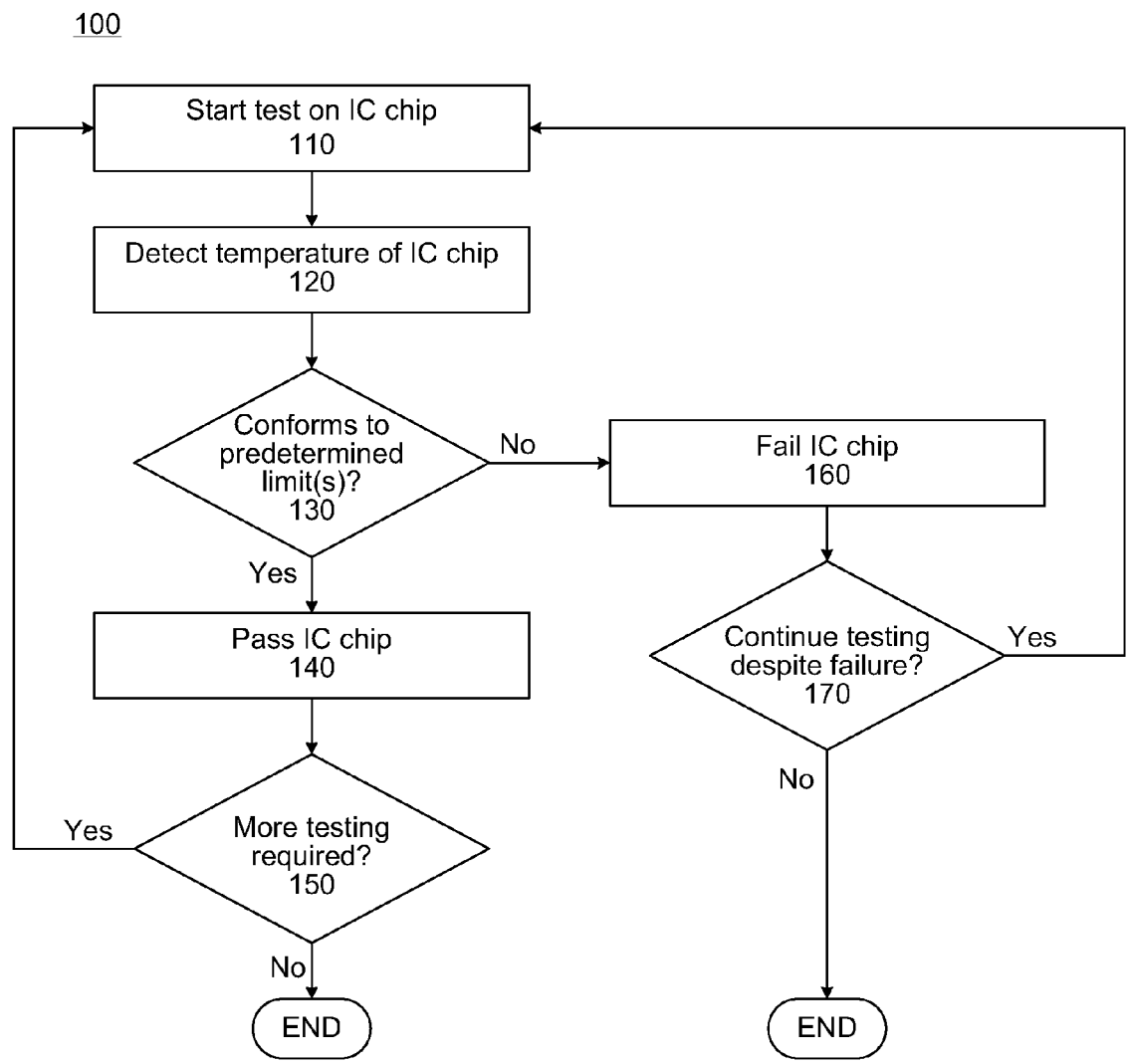
FIG. 1 is a testing method, in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

The phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Embodiments of the present invention are directed to methods and apparatuses for thermally monitoring an integrated circuit (IC) chip during a test operation. Among other benefits, such thermal monitoring during the test operation may be important for characterizing and/or isolating failures of the IC chip. For example, in some embodiments, collecting temperature data while subjecting the IC chip to a test operation may be used for making design changes to IC chips for improved efficiency or performance. In some cases, thermal monitoring during a test operation may be used so that temperature data may be collected for a known-good IC chip to generate a baseline against which other similar IC chips may be tested.

According to various embodiments, the IC chip may include a thermal diode embedded therein for sensing the temperature of the chip in substantially real-time during the test operation. The thermal diode may be disposed at a location of the IC chip known to exhibit temperature variations, increased temperatures, etc., to account for thermal gradients across the IC chip. For example, it may be desirable to locate the thermal diode at the core of the IC chip. Still further, in various embodiments, the IC chip may include more than one thermal diode.

In general, the temperature of the IC chip may be measured using a thermal diode by passing different currents through the thermal diode and calculating the voltage differential, the voltage differential being indicative of temperature. The thermal diode may be further configured to output a signal representative of the measured temperature for detection by a testing apparatus, as discussed more fully herein. The thermal diode may be any thermal diode known in the art suitable for various purposes and operations as described herein.

With regard to tests and associated test operations to which the IC chip may be subjected, as is generally known in the art, IC chips may undergo any one or more of various tests to ensure quality of the chip or similar chips. For example, a test may be performed to determine reliability, functionality, or other quality aspects of an IC chip. A test may comprise one or more electrical stimuli, in the form of one or more test patterns (multiple test patterns may sometimes be referred to in the art as a test suite). Sometimes, the electrical stimuli to which an IC chip is subjected may be designed to be similar to conditions expected to be encountered during field use, or in some cases, the worst conditions expected to be encountered by the IC chip.

Referring now to FIG. 1, illustrated is an embodiment of a testing method 100. As illustrated at 110, a test operation is started on an IC chip including a thermal diode. The test operation may include one or more test patterns or one or more test suites, depending on the application. During the test operation, the temperature of the IC chip in response to one or more of the electrical stimuli provided to the IC chip as part of the test operation may be detected at 120. According to various embodiments, the detection of temperature may comprise active or passive detection, depending on the application. For example, in some embodiments, a testing apparatus may actively detect signals provided from the IC chip on a periodic basis or may instead passively await the provision of temperature signal(s) from the IC chip.

In accordance with various embodiments, method 100 may include determining whether the detected temperature conforms, at least in part, to a predetermined temperature limit at 130. A temperature limit may comprise a maximum temperature limit or a minimum temperature limit, depending on the application. For example, guardband(s) may be generated based on a level of quality or performance desired from the IC chip, and the guardband(s) may be used to segregate acceptable IC chips from unacceptable IC chips. At 140, for example, if the IC chip is determined to conform to predetermined temperature limit(s), then the IC chip is designated as a passing IC chip at 140. If, however, the IC chip is determined to not conform to the predetermined temperature limit(s), then the IC chip is designated as a failing IC chip at 160.

In various embodiments, the detection of the temperature of the IC chip at 120 may include one or more temperature readings, depending on the application. For example, a testing apparatus may be configured to detect the temperature of the IC chip more than once and one or more of the detected temperatures may form the basis for whether the IC chip passes or fails the test. So, for example, a predetermined thermal profile including a plurality of temperatures may be used for determining whether the IC chip's detected temperatures are passing or failing. In still further embodiments, an exemplary method may include detecting a temperature and if the temperature is a failing temperature, detecting another temperature and only failing the IC chip if both temperatures are failing. Those skilled in the art will recognize that the described testing methods are exemplary in nature and that various testing methodologies are possible within the scope of the present disclosure.

According to the exemplary method illustrated in FIG. 1, if the IC chip is determined to be passing at 130, it may be further determined at 150 whether further testing on the IC chip is required. For example, multiple tests may be included in a test suite and in that case, the testing may continue, or in some embodiments, the IC chip may be required to endure multiple test suites before a final disposition of the IC chip is made.

If, on the other hand, the IC chip is determined to be failing at 130, it may be further queried at 170 whether testing should be continued on the IC chip despite the failing temperature. For example, an IC chip may fail one or more tests of a test suite yet it may still be determined that the IC chip still passes the test suite overall.

Figure 2:
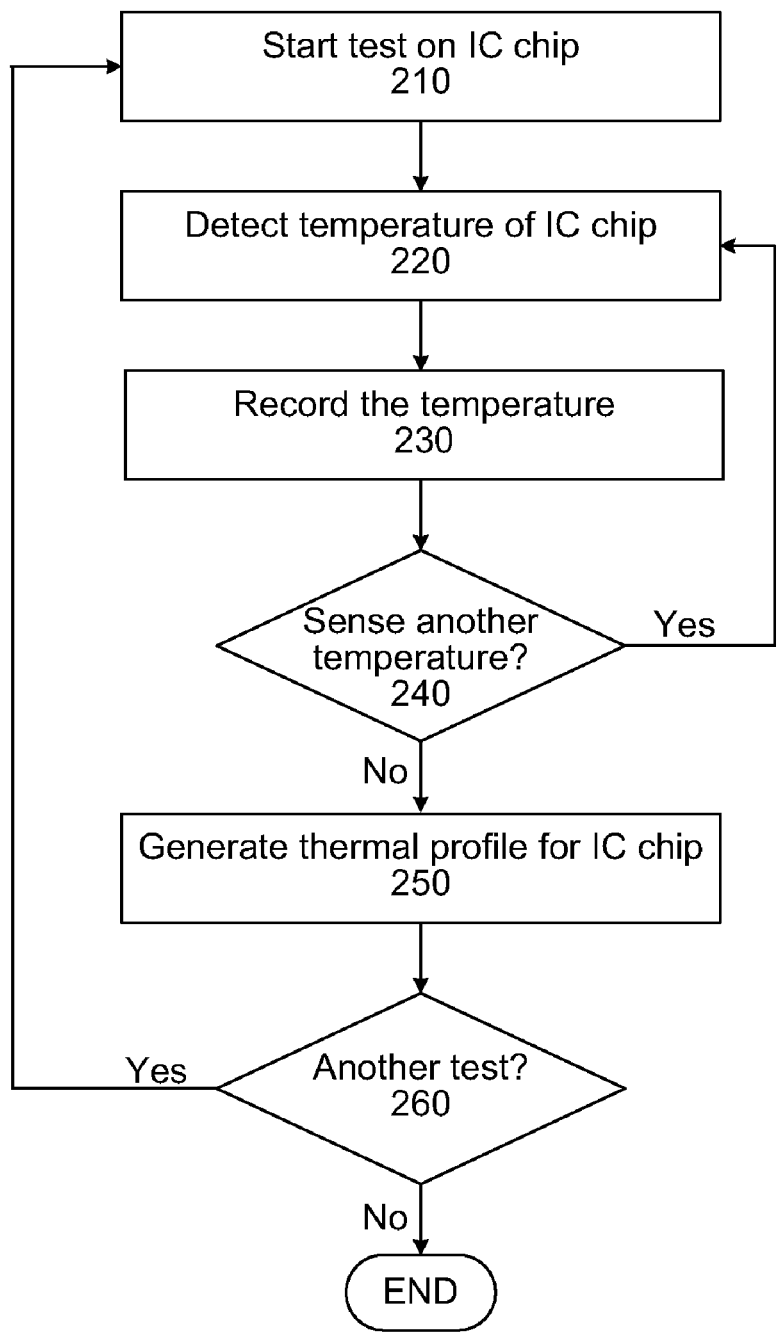
FIG. 2 is another testing method, in accordance with various embodiments of the present invention.

An exemplary method for generating a thermal profile is illustrated in FIG. 2. A thermal profile may be used for characterizing an IC chip and/or for further generating a guardband for later use in testing of similar IC chips (e.g., according to the method of FIG. 1). According to such an exemplary method, a test is started on a known-good IC chip including a thermal diode at 210. The test operation may include one or more test patterns or one or more test suites, depending on the application. Further, the test operation may be the same test operation as used in the exemplary method of FIG. 1, or may be a different test operation, depending on the application.

During the test operation, the temperature of the IC chip may be detected at 220. The temperature of the IC chip in response to one or more of the electrical stimuli provided to the IC chip as part of the test operation. According to various embodiments, the detection of temperature may comprise active or passive detection, depending on the application. For example, in some embodiments, a testing apparatus may actively detect signals provided from the IC chip on a periodic basis or may instead passively await the provision of temperature signal(s) from the IC chip.

In accordance with various embodiments, method 200 may include recording the detected temperature at 230. If another temperature reading is desired at 240, then another temperature reading of the IC chip may be detected and recorded, as many times as necessary to generate a desired thermal profile at 250. If a thermal profile for the IC chip using another test operation is desired at 260, then the entire process may be repeated, including some or all of the operations as illustrated.

Figure 3:
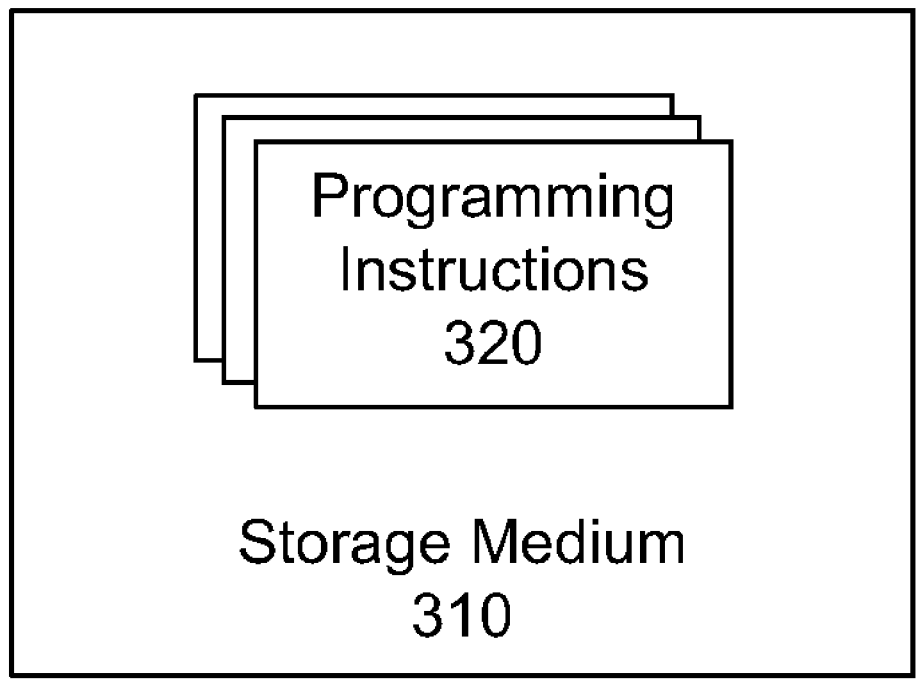
FIG. 3 is an article of manufacture, in accordance with various embodiments of the present invention.

In exemplary embodiments of the present invention, articles of manufacture and/or apparatuses may be employed to perform one or more methods as disclosed herein. For example, an article of manufacture may be adapted to enable an apparatus to detect a signal representative of a temperature sensed by an IC chip's thermal diode while performing a test operation on the IC chip. In the exemplary embodiment illustrated in FIG. 3, an article of manufacture 300 may comprise a storage medium 310 and a plurality of programming instructions 320 stored in storage medium 310. In various ones of the embodiments, programming instructions 320 may be adapted to program a testing apparatus to enable the testing apparatus to detect temperature signals from an IC chip's thermal diode while performing a test operation on the IC chip according to various methods in accordance with the present invention. With regard to storage medium 310, said storage medium 310 may take a variety of forms including, but not limited to, volatile and persistent memory, such as, but not limited to, compact disc read-only memory (CDROM) and flash memory.

Figure 4:
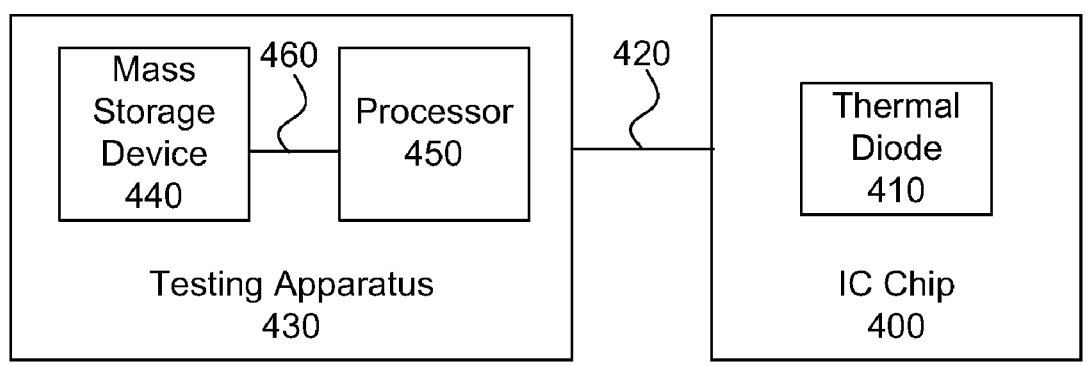
FIG. 4 is a testing apparatus and an integrated circuit (IC) chip, in accordance with various embodiments of the present invention.

An exemplary IC chip 400 and testing apparatus 430 are illustrated in FIG. 4. IC chip 400 includes a thermal diode 410 embedded therein, which may be used for sensing the temperature of IC chip 400. Testing apparatus 430 may be configured to measure the temperature of IC chip 400, as sensed by thermal diode 410, by accessing an input/output signal pin 420 operatively coupled to IC chip 400.

Testing apparatus 430 may be configured to perform one or more of various test operations on IC chip 400 while also detecting one or more signals representative of temperature (s) sensed by thermal diode 410 in response to the test operation(s). For example, as illustrated, testing apparatus 430 may include a mass storage device 440 having stored therein a plurality of programming instructions implementing all or selected aspects of the embodiments of methods of the invention as described herein. According to various embodiments, mass storage device 440 may take a variety of forms including, but are not limited to, a hard disk drive, a compact disc (CD) drive, a digital versatile disk (DVD) drive, a floppy diskette, a tape system, and so forth. With regard to the programming instructions, said instructions may be designed to facilitate performing of one or more test operations on IC chip 400, and detecting temperature signals from IC chip 400 via signal pin 420. Testing apparatus 430 may also include at least one processor 450 coupled to mass storage device 440 via bus 460 to execute the programming instructions.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method for testing a known-good integrated circuit chip including a thermal diode embedded therein, the method comprising:
    performing a first test operation on the known-good integrated circuit chip;
    during the first test operation, detecting a signal representative of a first temperature sensed by the thermal diode;
    performing a second test operation on the known-good integrated circuit chip;
    during the second test operation, detecting a signal representative of a second temperature sensed by the thermal diode;
    generating a thermal profile for the known-good integrated circuit chip based at least in part on the first temperature and the second temperature;
    determining a first temperature limit and a second temperature limit, the first temperature limit and the second temperature limit being respectively associated with the first test operation and the second test operation, wherein said determining is based at least in part on the thermal profile; and
    generating a guardband using the first temperature limit and the second temperature limit, the guardband being used to test integrated circuit chips that are similar to the known-good integrated circuit chip.

2. The method of claim 1, wherein the first test operation comprises providing one or more electrical stimuli to the known-good integrated circuit chip.

3. A testing apparatus comprising:
    a mass storage device having stored therein a plurality of programming instructions, the plurality of programming instructions designed to facilitate:
        performing a first test operation on a known-good integrated circuit chip including a thermal diode embedded therein;
        during the first test operation, detecting a signal representative of a first temperature sensed by the thermal diode;
        performing a second test operation on the known-good integrated circuit chip;
        during the second test operation, detecting a signal representative of a second temperature sensed by the thermal diode;
        generating a thermal profile for the known-good integrated circuit chip based at least in part on the first temperature and the second temperature;

determining a first temperature limit and a second temperature limit, the first temperature limit and the second temperature limit being respectively associated with the first test operation and the second test operation, wherein said determining is based at least in part on the thermal profile; and generating a guardband based at least in part on the first temperature limit and the second temperature limit, the guardband being used to test integrated circuit chips that are similar to the known-good integrated circuit chip; and at least one processor coupled to the mass storage device to execute the programming instructions.

4. The testing apparatus of claim 3, wherein the first test operation comprises providing one or more electrical stimuli to the known-good integrated circuit chip.

5. An article of manufacture, comprising:
a storage medium; and
a plurality of programming instructions stored in the storage medium, the plurality of programming instructions configured to program an apparatus to enable the apparatus to:
perform a first test operation on a known-good integrated circuit chip including a thermal diode embedded therein;
during the first test operation, detect a signal representative of a first temperature sensed by the thermal diode;
perform a second test operation on the known-good integrated circuit chip;
during the second test operation, detect a signal representative of a second temperature sensed by the thermal diode;
generate a thermal profile for the known-good integrated circuit chip based at least in part on the first temperature and the second temperature;
determine a first temperature limit and a second temperature limit, the first temperature limit and the second temperature limit being respectively associated with the first test operation and the second test operation, wherein the first temperature limit and the second temperature limit are determined based at least in part on the thermal profile; and
generate a guardband based at least in part on the first temperature limit and the second temperature limit, the guardband being used to test integrated circuit chips that are similar to the known-good integrated circuit chip.

6. The article of claim 5, wherein the first test operation comprises providing one or more electrical stimuli to the known-good integrated circuit chip.

* * * * *

UNITED STATES PATENT AND TRADEMARK OFFICE
CERTIFICATE OF CORRECTION

PATENT NO. : 8,152,372 B1
APPLICATION NO. : 12/121581
DATED : April 10, 2012
INVENTOR(S) : Peng et al.

It is certified that error appears in the above-identified patent and that said Letters Patent is hereby corrected as shown below:

Cover Page, Item (75) change inventor "Hsui-Peng Peng" to -- Hsiu-Ping Peng --.

Signed and Sealed this
Ninth Day of October, 2012

David J. Kappos
*Director of the United States Patent and Trademark Office*